(12) United States Patent
Takada

(10) Patent No.: US 6,986,675 B2
(45) Date of Patent: Jan. 17, 2006

(54) DEVICE FOR ACCOMMODATING INSERTS

(75) Inventor: Masahiko Takada, Hirakata (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 86 days.

(21) Appl. No.: 10/704,660

(22) Filed: Nov. 12, 2003

(65) Prior Publication Data

US 2004/0095731 A1 May 20, 2004

(30) Foreign Application Priority Data

Nov. 15, 2002 (JP) ........................ 2002-331492

(51) Int. Cl.
*H01R 13/62* (2006.01)

(52) U.S. Cl. ..................................... 439/159

(58) Field of Classification Search ................. 439/159, 439/152, 155, 160, 630, 637, 310; 361/754, 361/798, 801

See application file for complete search history.

(56) References Cited

U.S. PATENT DOCUMENTS 6,059,588 A  *  5/2000  Tung et al. ................. 439/159
6,059,589 A  *  5/2000  Nishioka .................... 439/159
6,361,338 B1 *  3/2002  Chang ........................ 439/159
6,790,061 B1 *  9/2004  Lai et al. .................... 439/159

FOREIGN PATENT DOCUMENTS

JP          10-50406        2/1998
JP          11-54208        2/1999

* cited by examiner

*Primary Examiner*—Phuong T. Vu
(74) *Attorney, Agent, or Firm*—Armstrong, Kratz, Quintos, Hanson & Brooks, LLP

(57) ABSTRACT

A cam groove provided in a chassis is furnished with a first cam portion permitting an eject button to move only forward from being depressed, and a second cam portion permitting the button to shift between its depressed and protruding states. A slide unit interlocks with a switching lever spring-urged toward a push-out plate and moves away from a recording-medium travel path by being pushed by a recording medium when plugged into the chassis. In standby, the switching lever interlocks with the first cam portion, advancing into the travel path. With a recording medium bieng plugged into the chassis, by the eject button being pushed a first time the switching lever withdraws from the travel path and shifts into the second cam portion, permitting the eject button to protrude backward. By the eject button being pushed a second time, the push-out plate and slide unit are put into cooperation.

2 Claims, 13 Drawing Sheets

EJECT BUTTON DEPRESSED TWO TIMES

EJECTED STATE

RECORDING MEDIUM INSERTED

EJECT BUTTON DEPRESSED ONE TIME

EJECT BUTTON PROTRUDING

EJECT BUTTON DEPRESSED TWO TIMES

FIG. 15

WITH RECORDING MEDIUM BEING INSTALLED

| | EJECT BUTTON POSITION | |
|---|---|---|
| | DEPRESSED | PROTRUDING |
| STANDBY | O | |
| RECORDING MEDIUM INSERTED | O | |
| EJECT BUTTON PUSHED | | O |
| EJECT BUTTON PUSHED AGAIN | O | |

WITH NO RECORDING MEDIUM BEING INSTALLED

| | EJECT BUTTON POSITION | |
|---|---|---|
| | DEPRESSED | PROTRUDING |
| STANDBY | O | |
| EJECT BUTTON PUSHED | O | |
| EJECT BUTTON PUSHED AGAIN | O | |

FIG. 16 (a) PRIOR ART
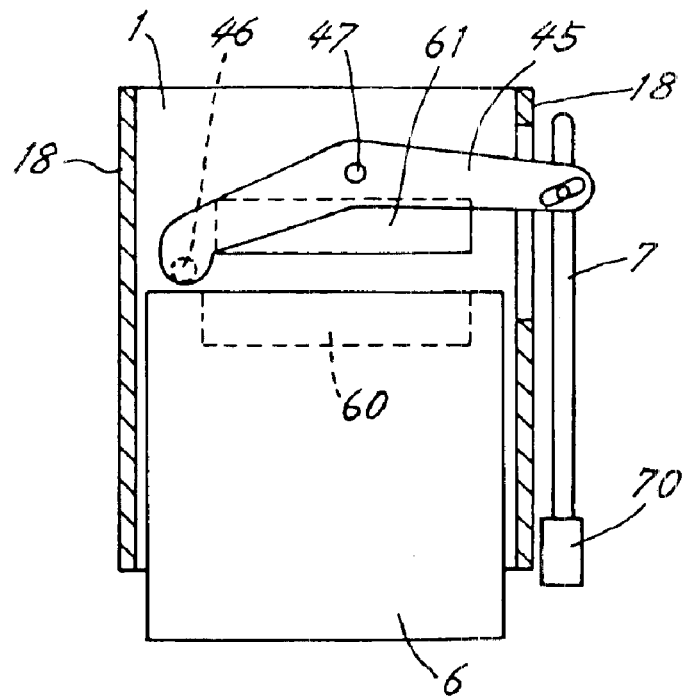
FIG. 16 (b) PRIOR ART
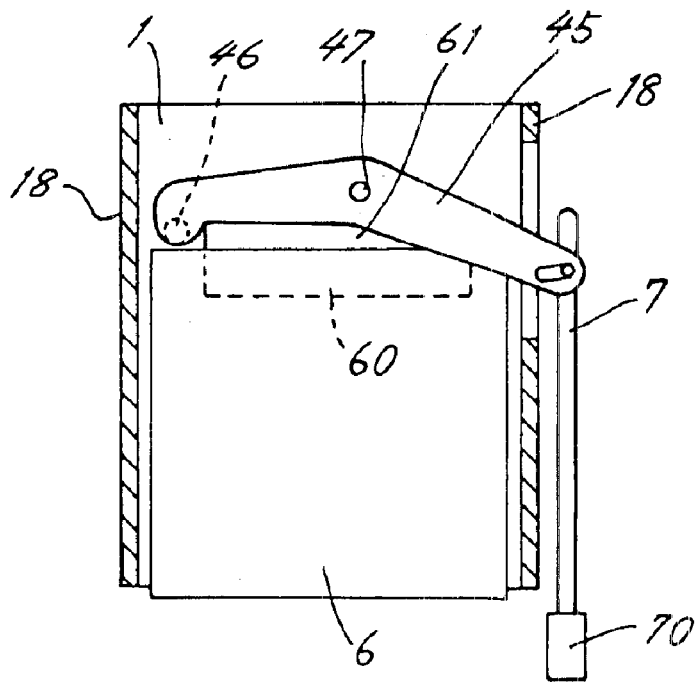

FIG. 19 PRIOR ART

WITH RECORDING MEDIUM BEING INSTALLED

|  | EJECT BUTTON POSITION | |
|---|---|---|
|  | DEPRESSED | PROTRUDING |
| STANDBY | ○ |  |
| RECORDING MEDIUM INSERTED | ○ |  |
| EJECT BUTTON PUSHED |  | ○ |
| EJECT BUTTON PUSHED AGAIN | ○ |  |

WITH NO RECORDING MEDIUM BEING INSTALLED

|  | EJECT BUTTON POSITION | |
|---|---|---|
|  | DEPRESSED | PROTRUDING |
| STANDBY | ○ |  |
| EJECT BUTTON PUSHED |  | ○ |
| EJECT BUTTON PUSHED AGAIN | ○ |  |

DEVICE FOR ACCOMMODATING INSERTS

BACKGROUND OF THE INVENTION

1. Field of the Invention

The present invention relates to devices into which inserts—specifically, recording mediums furnished with a connector on one end and incorporating electronic circuitry—install detachably/reattachably.

2. Description of the Related Art

FIGS. 16(a) and 16(b) are partial sectional plan views of a conventional device, wherein (a) shows a standby state, in which a recording medium is not mounted in the device, and (b) shows a state in which a recording medium is mounted in the device (see, for example, Japanese Laid-Open Pat. App. Pub. No. 10-50406). A recording medium 6 such as an IC card is furnished with a first connector 60 on its one end. Hereinafter, the direction in which a recording medium is inserted into the device is referred to as "forward", and the direction in which the recording medium is ejected out of the device as "backward."

The device has sidewalls 18, 18 erected along both sides of a chassis 1. Provided in an inner part of the chassis 1 is a second connector 61 for fitting with the first connector 60. The structure for fitting the connectors 60 and 61 is well known.

On the chassis 1, a push-out lever 45 is supported on a pivot 47 near the second connector 61, and a right end portion of the push-out lever 45 is connected to a slide unit 7 that is provided outward of one sidewall 18 and is shiftable back and forth. A tail end portion of the slide unit 7 is provided with an eject button 70. From a left end portion of the push-out lever 45, a pin 46 protrudes downward.

In the standby state, the eject button 70 is depressed inward as shown in FIG. 16(a). When the recording medium 6 is inserted between the sidewalls 18, 18 with the first connector 60 facing forward, the front end of the recording medium 6 pushes the pin 46 of the push-out lever 45, swinging the push-out lever 45 clockwise. Accordingly, the slide unit 7 and the eject button 70 are forced to protrude backward. Upon completing the insertion of the recording medium 6, the connectors 60 and 61 fit together so that signals may be recorded in the recording medium 6 or be played back from the recording medium 6.

To eject the recording medium 6, the eject button 70 is pressed forwardly inward with the finger. The push-out lever 45 thereby swings counterclockwise, forcing the pushing pin 46 to push the front end of the recording medium 6 backward. The recording medium 6 is thus pushed out backward and is ejected out of the device.

In the standby state, the recording medium 6 will be unintentionally ejected in a situation in which, if the amount by which the eject button 70 protrudes is extensive, the eject button 70 is by some chance struck inadvertently by a user's hand. In view of this problem, as shown in FIG. 17, there is a configuration in which the eject button 70 is configured by two half-button portions 70a and 70b connected with a hinge 70c so that the backward half-button portion 70b is rotatable about 90 degrees clockwise relative to the front side half-button portion 70a. Thus, the amount of protrusion of the eject button 70 is made small.

With the eject button 70 shown in FIG. 17, there still remains a risk that the recording medium 6 will be accidentally ejected in a situation in which, if a user neglects the operation of swinging over the half-button portion 70b, the user's hand accidentally strikes the eject button 70. Furthermore, the user is required to take the trouble to fold the eject button 70, which is cumbersome and gives the impression that the device is a low-grade product.

In view of this, a device is proposed that performs operations shown in FIG. 19 (see Japanese Laid-Open Pat. App. Pub. No. 11-54208, for example). In this device, as shown in FIG. 18, the push-out levers 45, 45 for urging the recording medium 6 backward are supported on pivots 47, 47 on the chassis 1, and one sidewall 18 of the chassis 1 is provided with a cam mechanism (not shown) into which the slide unit 7 fits. In the standby state, in which the recording medium 6 is not inserted, the eject button 70 is at a forwardly depressed position. Even when the recording medium 6 is mounted in the device, the depressed position is maintained.

In this condition, if the eject button 70 is further pushed forwardly inward, the eject button 70 protrudes backward while the recording medium 6 is kept in the mounted state, as shown in FIG. 19. When the eject button 70 that has been protruded backward is pushed forwardly once again, the recording medium 6 is ejected out of the device, but the eject button 70 is kept in a forwardly depressed state. Specifically, in order to eject the recording medium 6 inserted in the device from the state where the eject button 70 is depressed forward, the eject button 70 needs to be pushed two times; therefore, even if the user's hand accidentally strikes the eject button 70 while in the state where the recording medium 6 is inserted in the device, the recording medium 6 is not ejected.

If the eject button 70 is pushed without inserting the recording medium 6 while in the standby state, the eject button 70 is kept in the forwardly depressed state. The recording medium 6 can be inserted in this condition. If the eject button 70 is pushed once again, the eject button 70 protrudes backward.

In the device that performs the operations shown in FIG. 19, however, while in its standby state, the eject button 70 may protrude backward from the depressed state. Accordingly, if the recording medium 6 is inserted into the device while the eject button 70 is in the backwardly protruding state, the recording medium 6 can be ejected out of the device by pushing the eject button 70 once more. Therefore, there remains a risk of accidentally ejecting the recording medium 6 out of the device if the user's hand accidentally hits the eject button 70 while the eject button 70 is in a backwardly protruding state. In other words, such a risk arises because of the possibility of the eject button 70's protruding backward while the recording medium 6 is not inserted in the device.

BRIEF SUMMARY OF THE INVENTION

It is therefore an object of the present invention to provide a device in which the eject button 70 is kept in a forwardly depressed state while in the standby state so that it does not protrudes backward accidentally.

In a device according to the present invention, a cam mechanism is furnished with a first cam portion 11 permitting a eject button 70 to move only forward from the depressed state, and a second cam portion 12 permitting the eject button 70 to move between the depressed state and the protruding state.

A slide unit 7 and the cam mechanism interlock with a switching mechanism 3 that is spring-urged toward a push-out member and that, by being pushed by a recording medium 6, which is an insert, against the spring when fitting the recording medium 6 into a chassis 1, withdraws from a travel path of the recording medium 6.

The switching mechanism 3 in its standby state performs a first movement in which it interlocks into the first cam portion 11 and advances into the travel path of the recording medium 6, and with the recording medium 6 being fitted into the chassis 1, a second movement in which it withdraws from the travel path of the recording medium 6, wherein by an initial pressing action on the eject button 70 it shifts into the second cam portion 12, permitting the eject button 70 to protrude backward, and by a second pressing action on the eject button 70 it permits the push-out member and the slide unit 7 to operate interconnectedly.

With No Recording Medium Being Inserted

The switching mechanism 3 enters the travel path of the recording medium 6 and interlocks in the first cam portion 11. Because the first cam portion 11 only permits the eject button 70 to move forward from its depressed state, the eject button 70 does not protrude backward.

With Recording Medium Being Inserted

The switching mechanism 3 withdraws from the travel path of the recording medium 6 by being pushed by the recording medium 6. At the first pushing operation for the eject button 70, the switching mechanism 3 shifts into the second cam portion 12, permitting the eject button 70 to protrude backward with the slide unit 7 spring-urged backward. At the second pushing operation for the eject button 70, the push-out member and the slide unit 7 operate inter-connectedly.

In a device according to the present invention, the eject button 70 is kept in a forwardly depressed state and is not protruded backward accidentally while in a standby state, in which the recording medium 6 is not inserted. Thus, unlike conventional cases, the recording medium 6 is not inserted while the eject button 70 is being in a protruding state, therefore, the recording medium 6 is not accidentally ejected out of the device.

BRIEF DESCRIPTION OF THE SEVERAL VIEWS OF THE DRAWINGS

For a more complete understanding of the present invention, and the advantages thereof, reference is now made to the following descriptions taken in conjunction with the accompanying drawings, in which:

FIG. 15 is a diagram representing operations of the device according to the present invention;

FIG. 16 are partly in section plan views of a conventional device, wherein (a) and (b) respectively show a standby state in which a recording medium is not mounted in the device and a state in which a recording medium is mounted in the device;

FIG. 19 is a diagram showing operations of the device shown in FIG. 18.

DETAILED DESCRIPTION OF THE INVENTION

With reference to the drawings, one embodiment of the present invention is detailed below.

Figure 1:
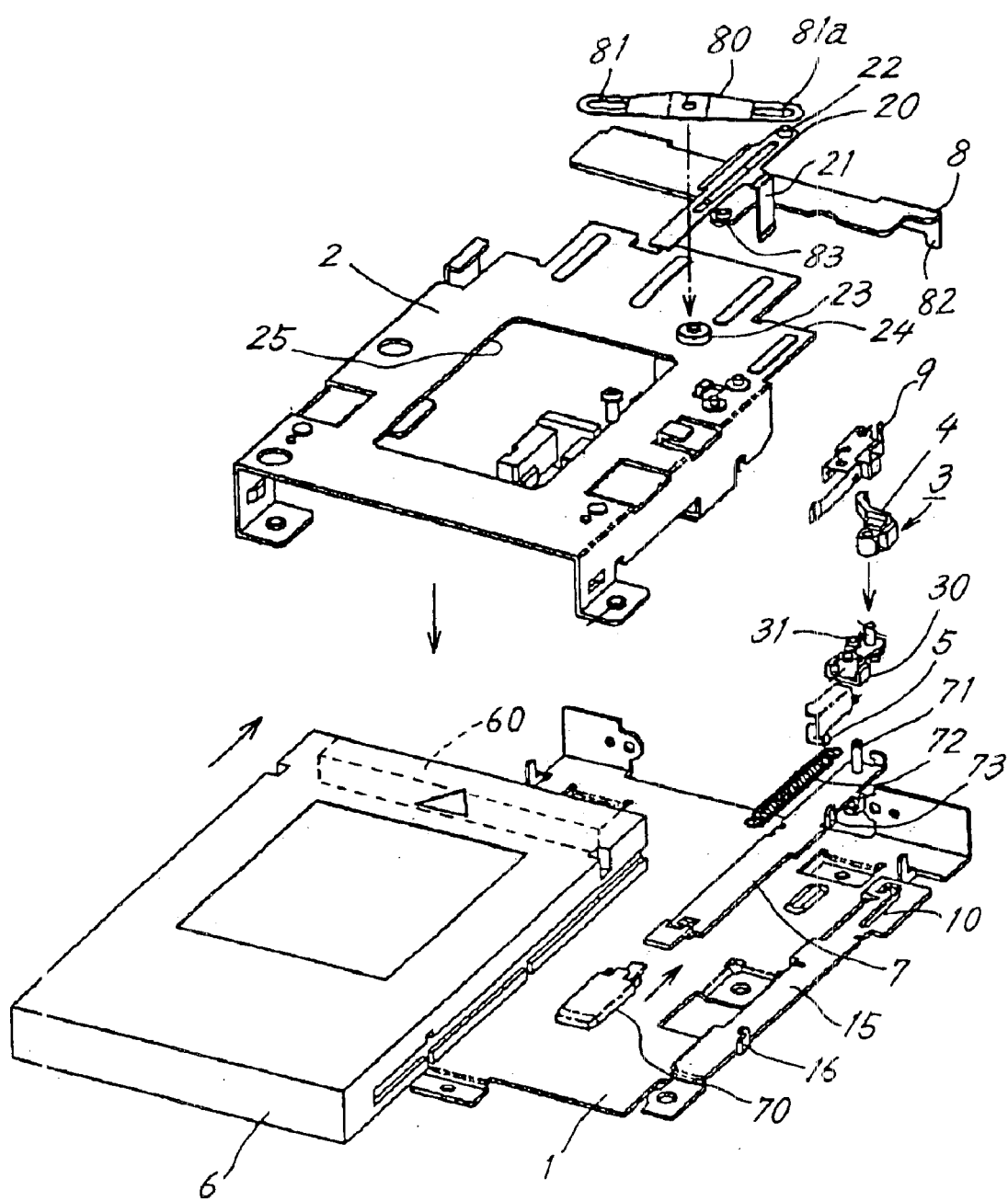
FIG. 1 is an exploded perspective view of the device.
Figure 18:
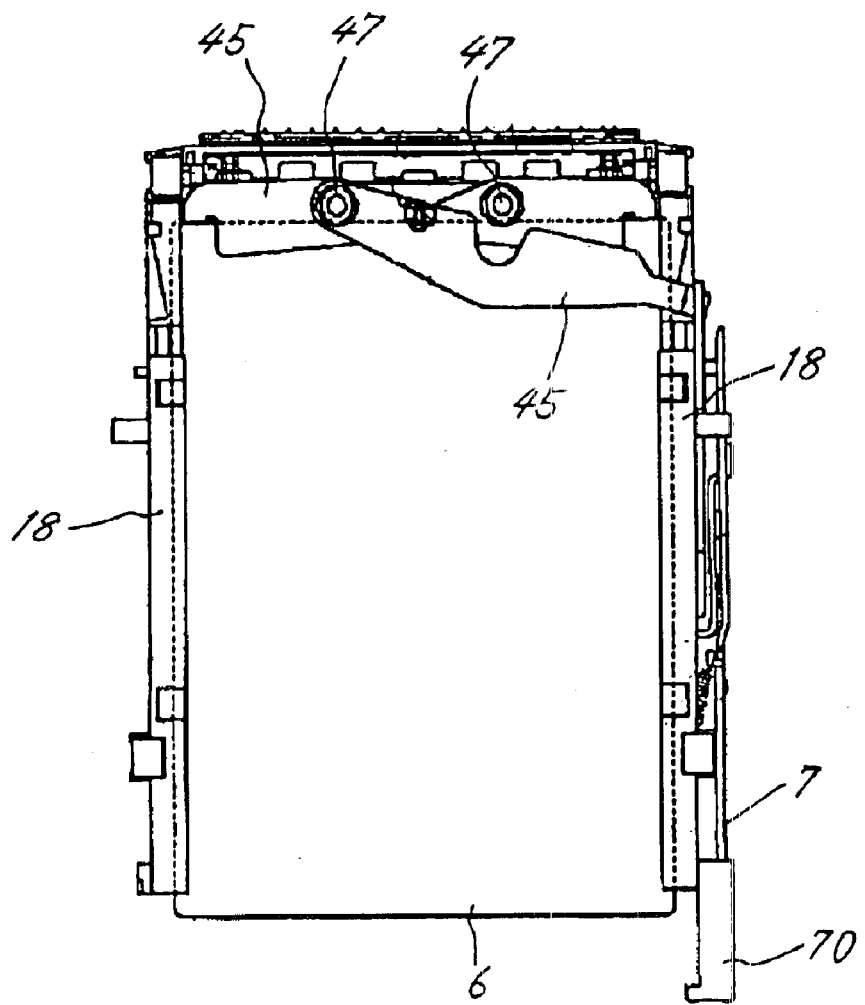
FIG. 18 is a plan view showing another conventional device.

FIG. 1 is an exploded perspective view of a device according to the present embodiment, and FIG. 2 through FIG. 5 are assembly diagrams of the device according to the present embodiment. The operations of the device according to the present embodiment are shown in FIG. 15, which are similar to those of the conventional device shown in FIG. 18 when the recording medium 6 is inserted in the device.

Figure 2:
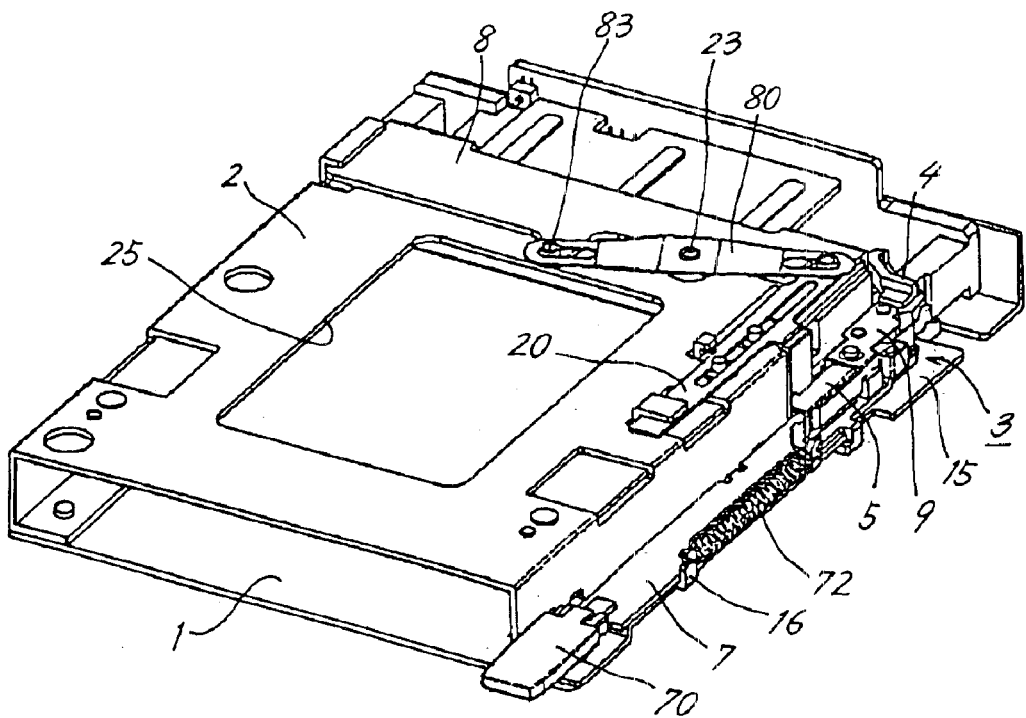
FIG. 2 is a perspective view of the device, showing its standby state.
Figure 3:
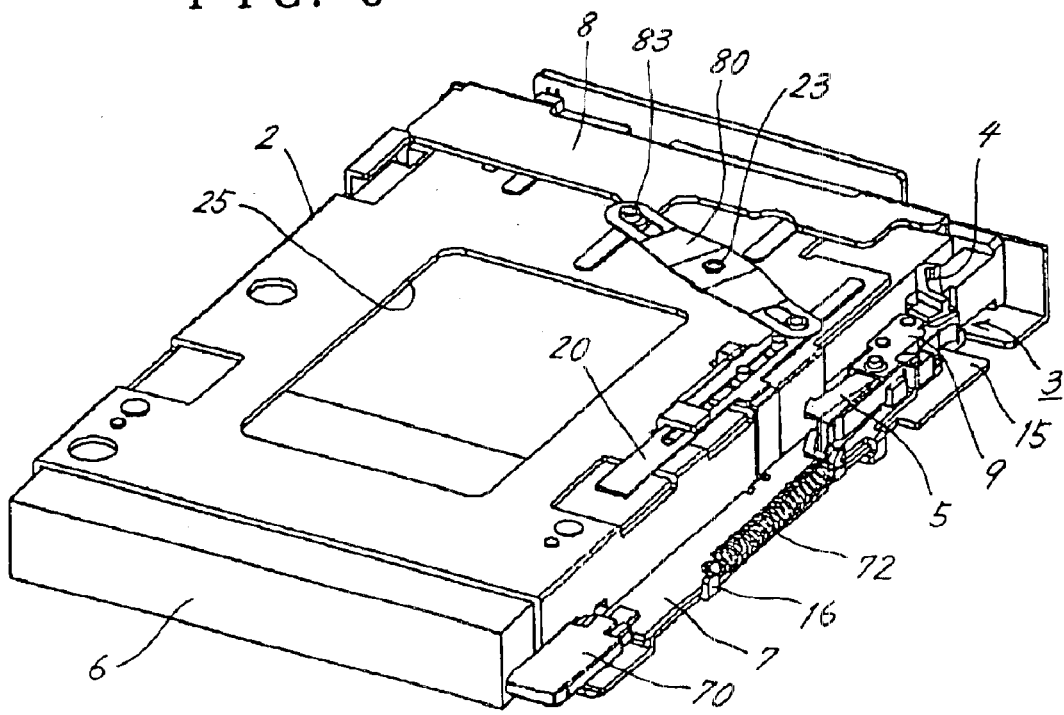
FIG. 3 is a perspective view of the device, showing a state in which a recording medium is mounted therein.
Figure 4:
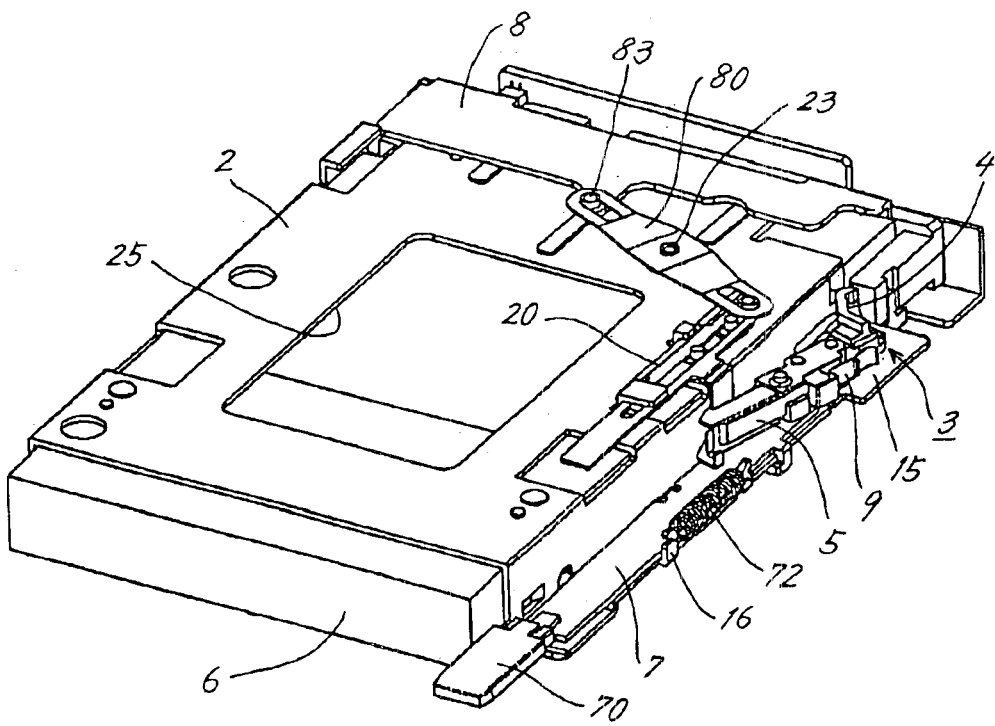
FIG. 4 is a perspective view of the device, showing a state in which an eject button has been pressed after the recording medium has been mounted.
Figure 5:
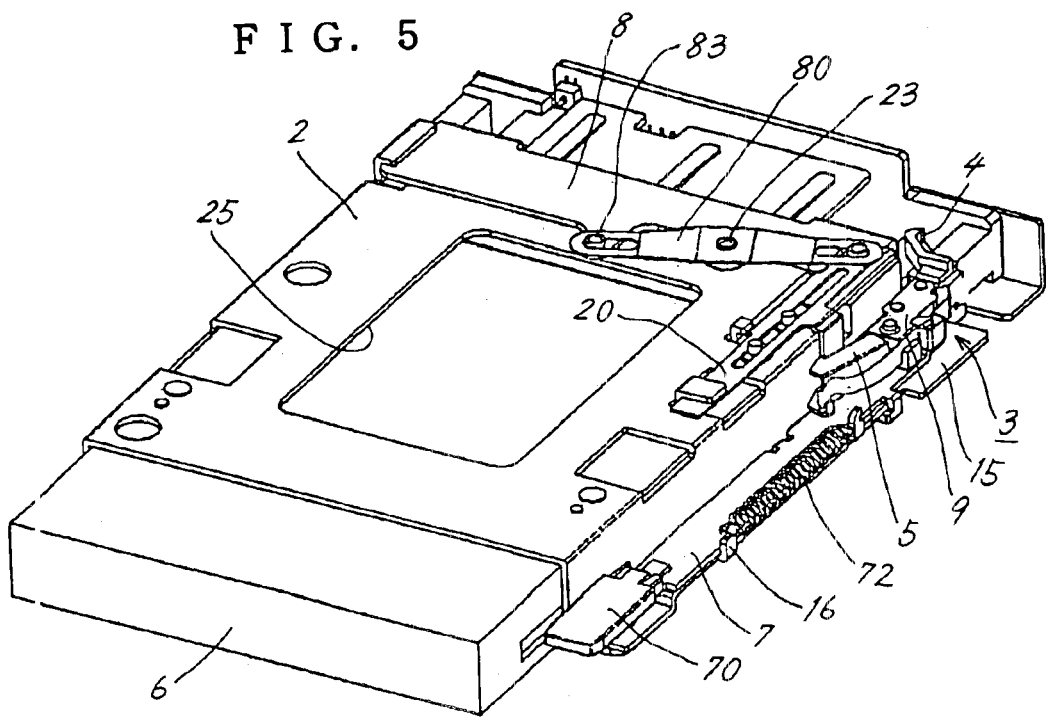
FIG. 5 is an assembly diagram of the device, showing a state in which the eject button has been pressed the second time after the recording medium has been mounted.

As shown in FIG. 2, in a standby state, the eject button 70 is pushed forwardly inward. As shown in FIG. 3, the eject button 70 is kept in a depressed state even when the recording medium 6 is inserted in the device. As shown in FIG. 4, the eject button 70 is pushed out backward when the eject button 70 is pushed one time, and as shown in FIG. 5, the recording medium 6 is ejected when the eject button 70 is further pushed, that is, when the eject button 70 is pushed two times. As will be described later, the present embodiment differs from conventional devices in how it operates in an instance in which the eject button 70 is pushed during the standby state, in which the recording medium 6 is not inserted in the device.

The present embodiment shows, as an example of the recording medium 6, a card type medium called iVDR, in which video and audio data can be recorded. This is furnished with, as shown in FIG. 1, a first connector 60 at its front end, so that it fits with a second connector (not shown) provided in the inner part of the a chassis when mounted on the chassis 1.

FIG. 1 is an exploded perspective view of the device according to the present embodiment. Attached to the chassis 1 is a holder 2 that has an opening at its rear end and in which the recording medium 6 is inserted. The top face of the holder 2 has a large opening 25 for confirming the presence or absence of the recording medium 6 in the holder 2. On the front end of the holder 2, a push-out plate 8 is provided so as to be shiftable back and forth, and the push-out plate 8 has a projection plate 82 extending downward at its front end. The projection plate 82 comes into contact with the front end of the recording medium 6 through a cut-out 24 provided in a right corner of the holder 2. A pivot shaft 23 provided on the holder 2 is fitted to a midportion of a drive lever 80, and a projection 83 provided on the push-out plate 8 is fitted in a long hole 81 formed in a left end portion of the drive lever 80. Thus, when the drive lever 80 swings, the push-out plate 8 slides back and forth accordingly.

At the right end of the holder 2, an intermediate slide plate 20 is provided so as to be shiftable back and forth, and a projection 22 provided on the front end of the intermediate slide plate 20 is fitted in a long hole 81a formed in a right end portion of the drive lever 80. A tab 21 extends downward from the intermediate slide plate 20.

The right end of the chassis 1 forms a receiving surface 15, a front end portion of which has cam groove 10 formed therein. A spring peg 16 protrudes from a right end portion of the receiving surface 15. On the receiving surface 15, a slide unit 7 is provided so as to be shiftable back and forth. The slide unit 7 is provided with a first pivot shaft 71 protruding from a front end portion thereof, and an eject button 70 is attached to a rear end portion thereof. A tension spring 72 is hooked between a hook 73 formed on the slide unit 7 and the spring peg 16 of the chassis 1 so that the slide unit 7 is urged backward. The first pivot shaft 71 of the slide unit 7 is fitted through a latch lever 5, an intermediate lever 30, and a torsion spring (not shown) urging the intermediate lever 30 counterclockwise. On a front end portion of the intermediate lever 30, a second pivot shaft 31 is provided, and the second pivot shaft 31 is fitted through a switching lever 4. A flat spring unit 9 formed by bending a metal plate is capped onto the intermediate lever 30.

Figure 6:
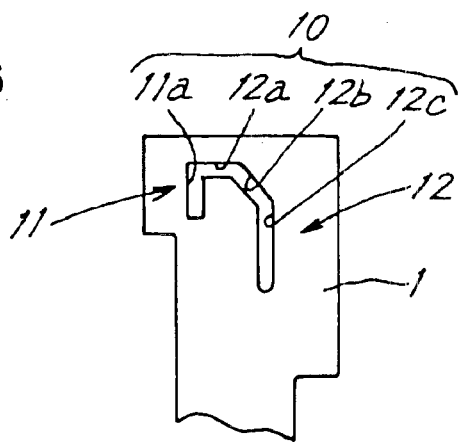
FIG. 6 is a plan view of a cam groove.

FIG. 6 is a plan view of a cam groove 10 on the chassis 1. The cam groove 10 has a first longitudinal groove 11a extending longitudinally, a transverse groove 12a extending rightward from the front end of the first longitudinal groove 11a, a diagonal groove 12b extending backward and rightward from the right end of the transverse groove 12a, and a second longitudinal groove 12c extending backward from the rear end of the diagonal groove 12b. The rear end of the second longitudinal groove 12c is located further backward of the rear end of the first longitudinal groove 11a. As will be described later, the first longitudinal groove 11a forms a first cam portion 11 that permits the eject button 70 to move only forward from the depressed state of the eject button 70, while the transverse groove 12a, the diagonal groove 12b, and the second longitudinal groove 12c together form the second cam portion 12 that permits the eject button 70 to shift between the depressed state and the protruding state.

Figure 7:
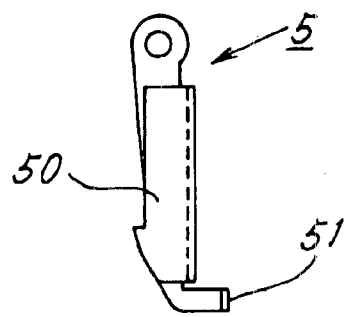
FIG. 7 is a plan view of a latch lever.

FIG. 7 is a plan view of the latch lever 5. The latch lever 5 is formed by bending a metal plate and is furnished with a claw piece 50, which on which a tab 21 of the intermediate slide plate 20 catches, as described later. The claw piece 50 is provided with a receiving piece 51 on its rear, and the inner surface of the receiving piece 51 comes into contact with the rear end of the flat spring unit 9.

Figure 8:
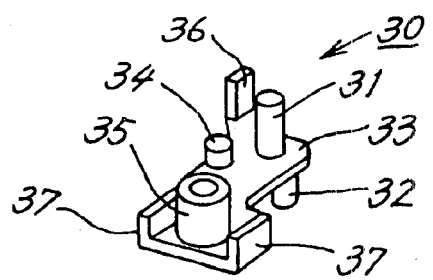
FIG. 8 is a perspective view of an intermediate lever.

FIG. 8 is a perspective view of the intermediate lever 30. The intermediate lever 30 is made of a synthetic resin and is provided with, in addition to the above-mentioned second pivot shaft 31, a positioning projection 34 for positioning the flat spring unit 9 and a fitting tube 35 for fitting onto the first pivot shaft 71 of the slide unit 7, both of which are on a flat plate 33. On the left of the second pivot shaft 31, a stopper 36 is provided for preventing the switching lever 4 from excessively swinging counterclockwise. At both sides of the fitting tube 35, wall plates 37, 37 are provided on the flat plate 33. From the lower surface of a front end portion of the flat plate 33, a cam follower 32 is protruded, which is a protruding shaft that fits into the cam groove 10 in the chassis 1.

Figure 9:
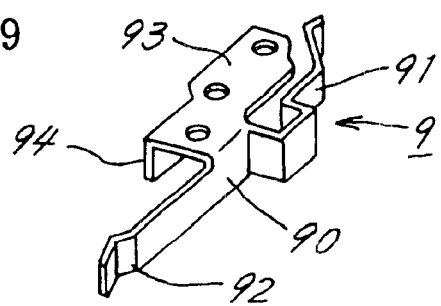
FIG. 9 is a perspective view of a flat spring unit.

FIG. 9 is a perspective view of the flat spring unit 9. The flat spring unit 9 is mounted over the intermediate lever 30 after the intermediate lever 30 has been fitted onto the first pivot shaft 71 and the switching lever 4 has been fitted onto the second pivot shaft 31 of the intermediate lever 30. In the flat spring unit 9, a fitting plate 94 and an urging plate 90 protrude downward from both sides of a horizontal plate 93. A front end portion of the urging plate 90 forms a first urging portion 91 for urging the switching lever 4 counterclockwise, whereas a rear end portion of the urging plate 90 forms a second urging portion 92 for urging the latch lever 5 clockwise. The forward end of the second urging portion 92 comes into contact with the inner side of the receiving piece 51 of the latch lever 5 so that when the flat spring unit 9 swings counterclockwise, the latch lever 5 swings counterclockwise accordingly.

For reasons stated below, the force with which the first urging portion 91 urges the switching lever 4 is configured to be greater than the force with which the torsion spring fitted onto the first pivot shaft 71 urges the intermediate lever 30 counterclockwise. The fitting plate 94 and a longitudinally mid portion of the urging plate 90 are fitted onto the inner sides of the wall plates 37, 37 of the intermediate lever 30, whereby the flat spring unit 9 is mounted onto the intermediate lever 30.

With a Recording Medium Being Inserted
During Insertion

FIG. 10 through FIG. 14 show plan views illustrating the operations of various components from when inserting the recording medium 6 into the device while in the standby state to when ejecting it. For the sake of simplicity in the drawings, only the components necessary for the operations are illustrated. The large opening 25 in the holder 2 is not shown.

Figures 10A, 10B:
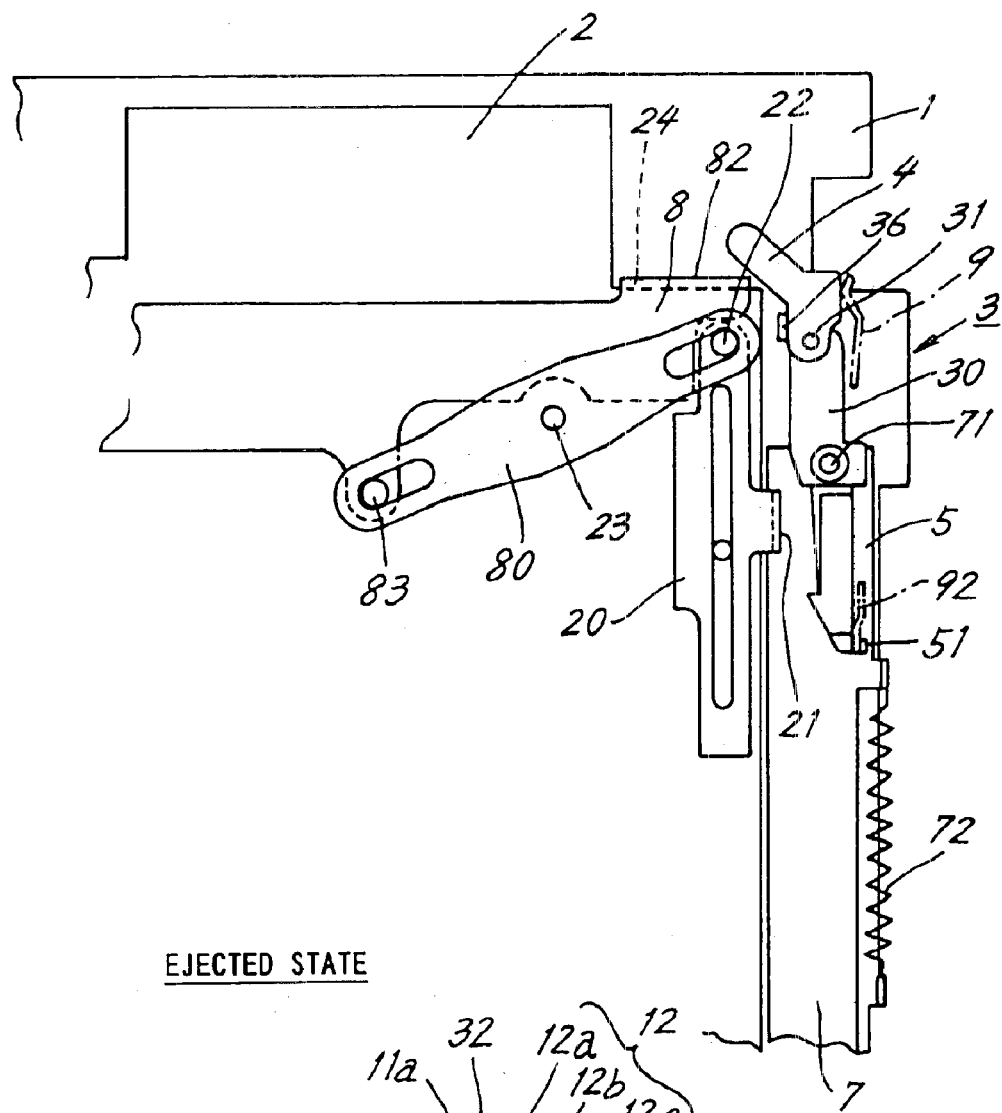
FIG. 10(a) is a plan view showing various components in a standby state.
FIG. 10(b) is a plan view showing the positional relationship between the cam groove and a cam follower.

FIGS. 2, 10(a), and 10(b) illustrate the standby state. The push-out plate 8 has been moved backward, and the projection plate 82 is brought into contact with the rear edge of the cut-out 24 of the holder 2. The switching lever 4 is pushed by the flat spring unit 9, making contact with the stopper 36 of the intermediate lever 30, and its fore-end portion enters the travel path of the recording medium 6 and the push-out plate 8. In this condition, the cam follower 32 of the intermediate lever 30 is located at the rear end of the first longitudinal groove 11a in the cam groove 10. The eject button 70 is, as shown in FIG. 2, at a forwardly depressed position. That is, when the cam follower 32 is fitted in the first longitudinal groove 11a of the cam groove 10, the eject button 70 is permitted to move only forward from the forwardly depressed position.

As will be described later, the switching lever 4 and the intermediate lever 30 together form a switching mechanism 3. The switching mechanism 3 performs a first movement by which the eject button 70 is held in its depressed state when the recording medium 6 is not in the holder 2, irrespective of the action of pushing the eject button 70. The switching mechanism 3 also performs a second movement by which the eject button 70 is switched between the depressed state and the protruding state by the action of the eject button 70 being pushed when the recording medium 6 is in the holder 2.

Figure 11:
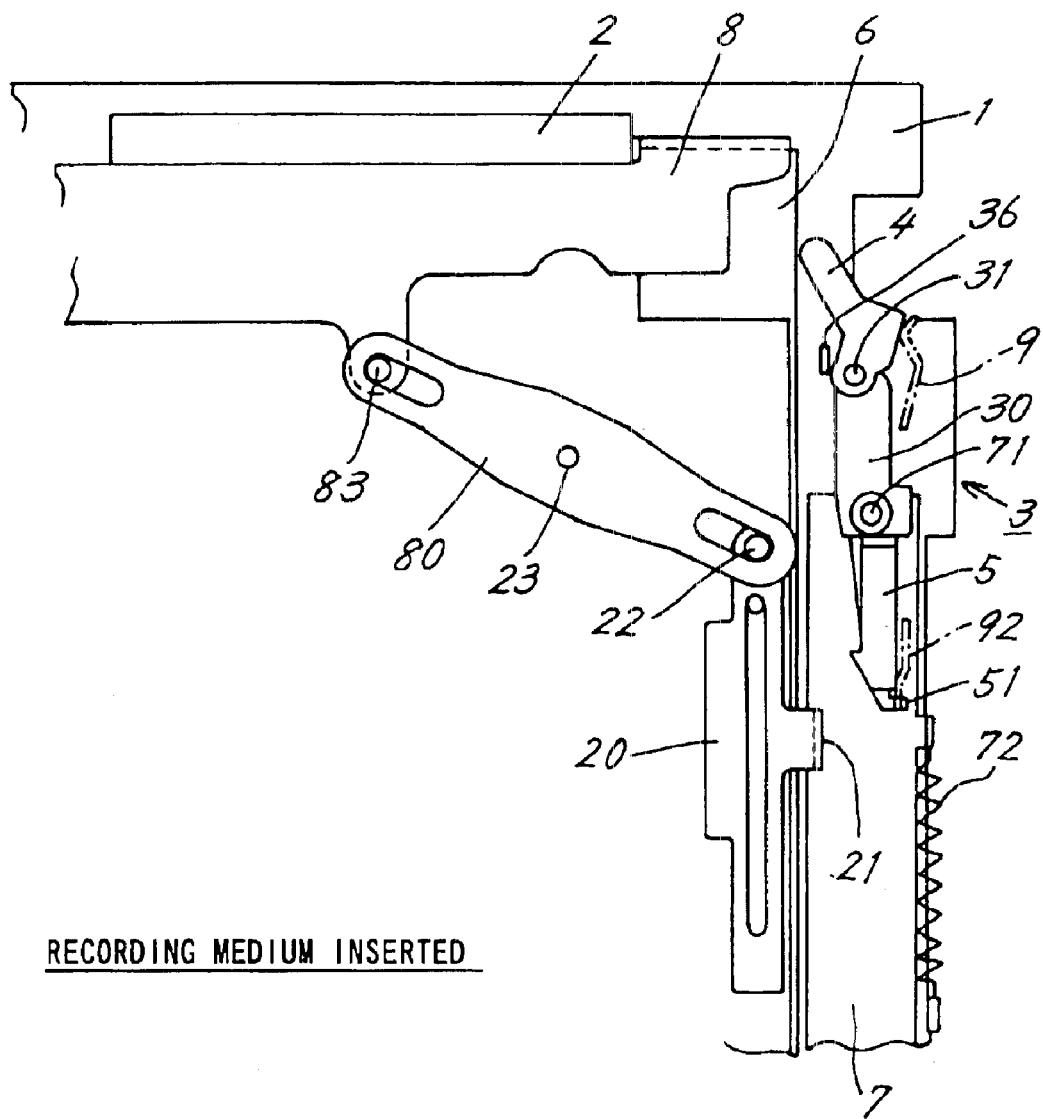
FIG. 11 is a plan view showing various components when a recording medium has been inserted.

When the recording medium 6 is inserted into the holder 2 in the standby state, as shown in FIGS. 3 and 11, the front end face of the recording medium 6 pushes the push-out plate 8 forward. The drive lever 80 accordingly swings clockwise with the pivot shaft 23 being the pivotal axis, forcing the intermediate slide plate 20 to move backward.

A side face of the recording medium 6 pushes the fore-end portion of the switching lever 4, and the switching lever 4 swings clockwise against the flat spring unit 9 with the second pivot shaft 31 being the pivotal axis. The intermediate lever 30 and the latch lever 5 do not move in longitudinal directions, and the cam follower 32 does not move from the position shown in FIG. 10(*b*), restricting swing movement of the intermediate lever 30.

The eject button 70 remains at the forwardly depressed position, and the first connector 60 of the recording medium 6 (see FIG. 1) fits in the second connector on the chassis 1; thus, the recording medium 6 is mounted on the chassis 1. In this condition, signal recording is possible into the recording medium 6, and signal playback is possible from the recording medium 6.

During Ejection

Figure 12:
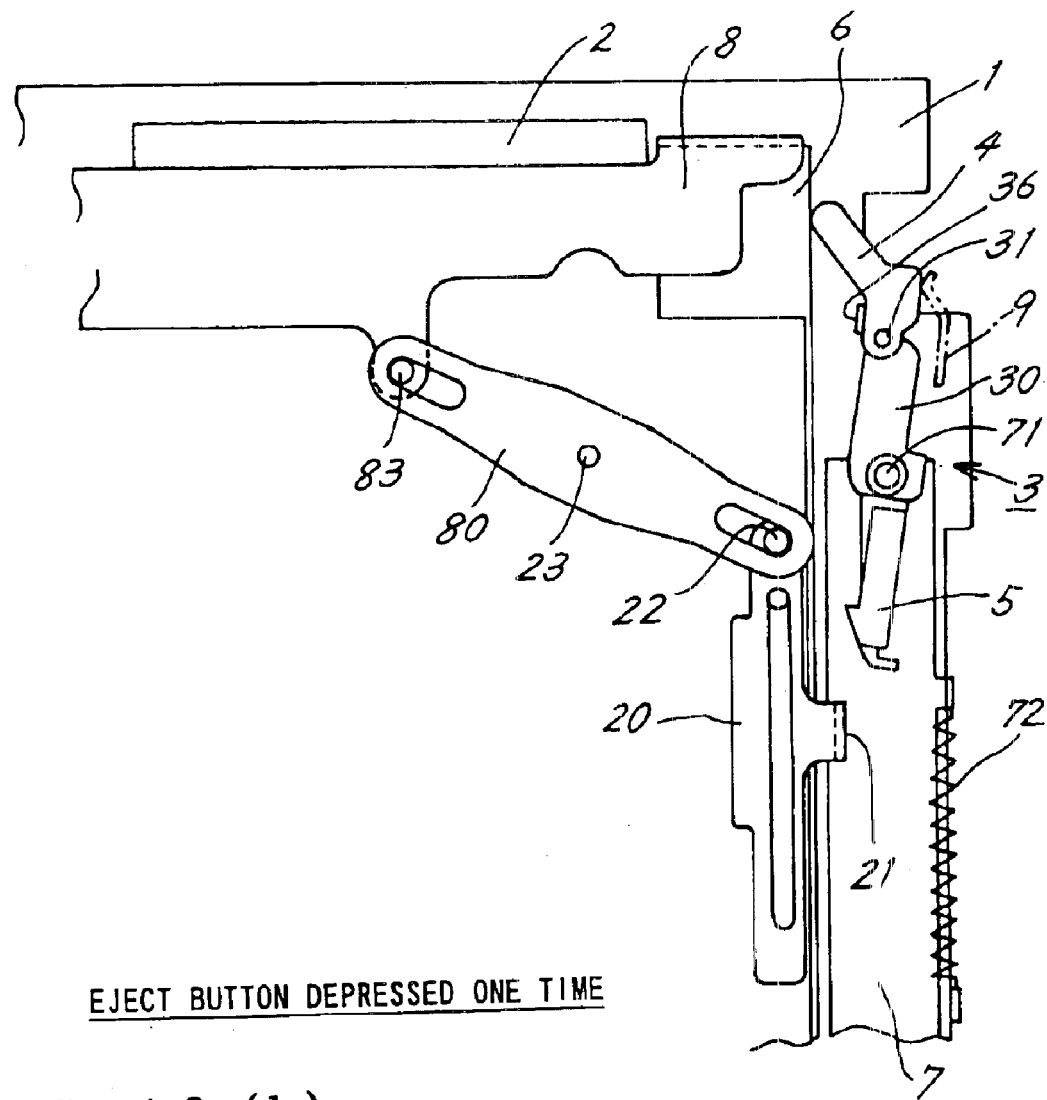
FIG. 12(a) is a plan view showing various components in a state where the eject button has been pressed one time.
FIG. 12(b) is a plan view showing the positional relationship between the cam groove and the cam follower.
Figure 12:
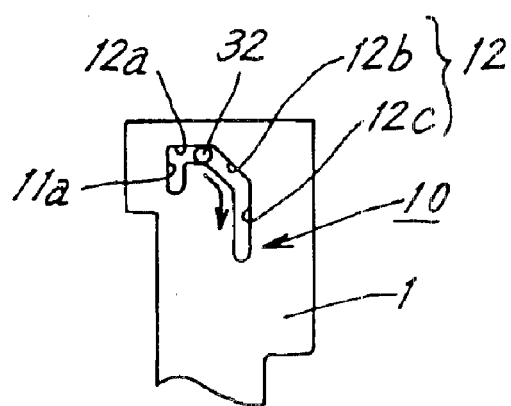

In order to eject the recording medium 6 out of the device after completion of signal recording or playback, first, the eject button 70 that has been depressed is further pushed against the tension spring 72. As shown in FIG. 12(*a*), the slide unit 7 moves forward, and the switching lever 4, the intermediate lever 30, and the latch lever 5 accordingly move forward. The cam follower 32 of the intermediate lever 30 reaches the left-side end of the transverse groove 12*a*, where its rightward movement is permitted. As described previously, the switching lever 4 is brought into contact with the side face of the recording medium 6 and is thereby pushed rightward. The switching lever 4 is pushed against the flat spring unit 9, and because the force with which the flat spring unit 9 urges the switching lever 4 is greater than the force with which the torsion spring urges the intermediate lever 30 counterclockwise as described previously, the intermediate lever 30 also swings rightward, i.e., clockwise. As shown in FIG. 12(*b*), the cam follower 32 reaches the right end of the transverse groove 12*a*.

Figure 13:
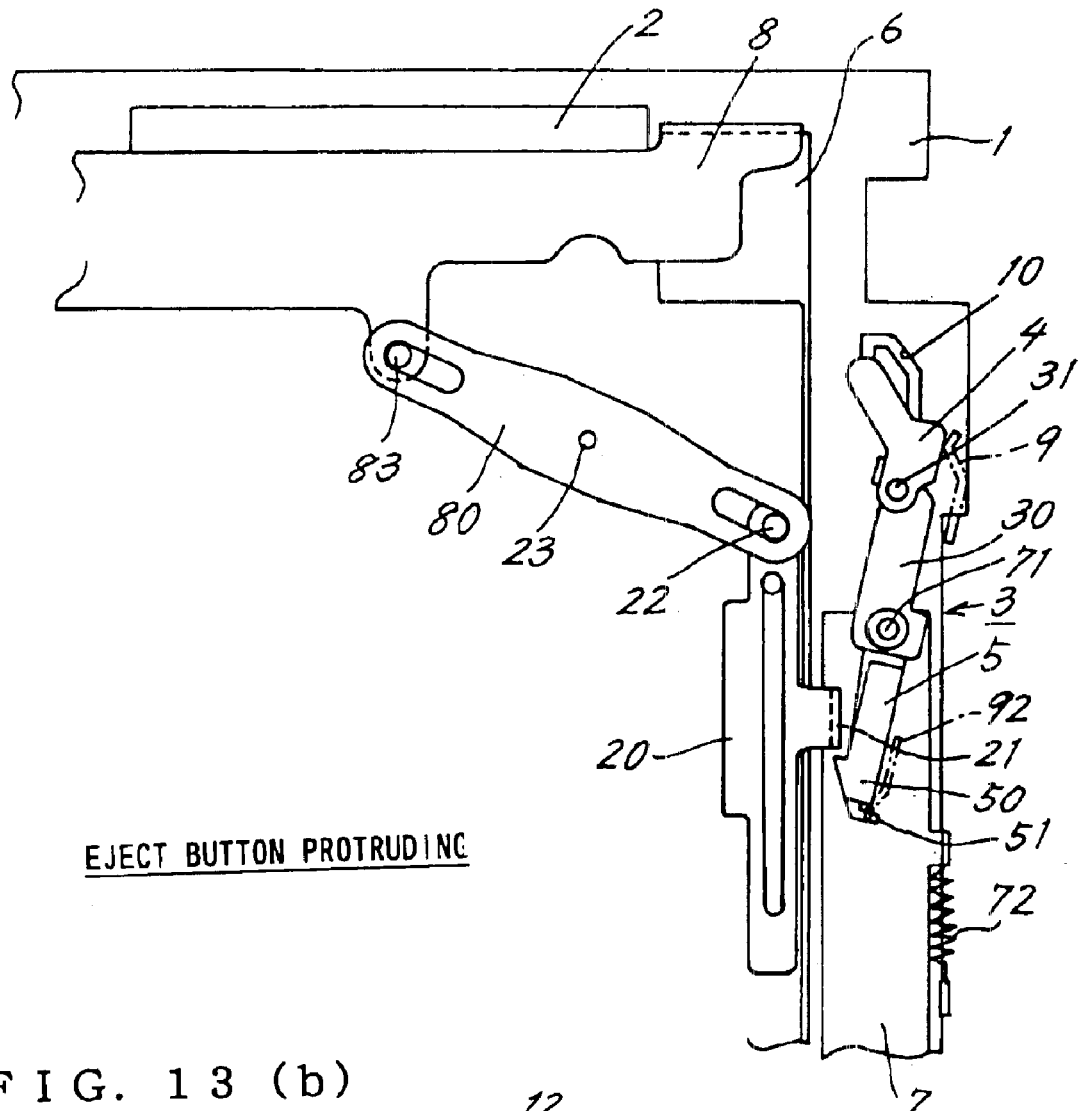
FIG. 13(a) is a plan view showing various components in a state where the eject button projects backward.
FIG. 13(b) is a plan view showing the positional relationship between the cam groove and the cam follower.
Figure 13:
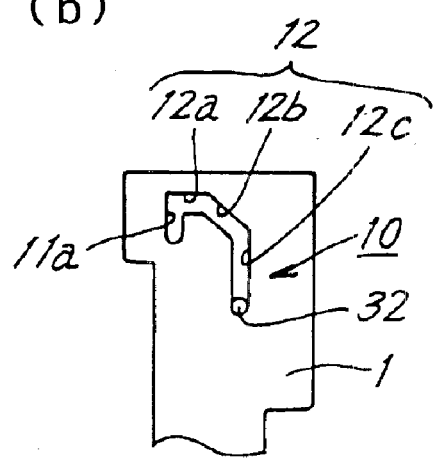

Because the slide unit 7 is urged backward by the tension spring 72, the cam follower 32 passes through the diagonal groove 12*b*, reaching the rear end of the second longitudinal groove 12*c* as shown in FIG. 13(*b*). Because the rear end of the second longitudinal groove 12*c* is located at a position further backward than the rear end of the first longitudinal groove 11*a*, the slide unit 7 moves backward, and the switching lever 4, the intermediate lever 30, and the latch lever 5 accordingly move backward, as shown in FIG. 13(*a*). The eject button 70 thus protrudes backward (see FIG. 4).

Because the second longitudinal groove 12*c* of the cam groove 10 shown in FIG. 13(*a*) is located further rightward than the first longitudinal groove 11*a*, the switching lever 4, the intermediate lever 30, and the latch lever 5 swing clockwise further than in the standby state. The latch lever 5 is pushed by the second urging portion 92 of the flat spring unit 9, swinging clockwise, and the claw piece 50 of the latch lever 5 is located at the rear of the tab 21 of the intermediate slide plate 20.

Figure 14:
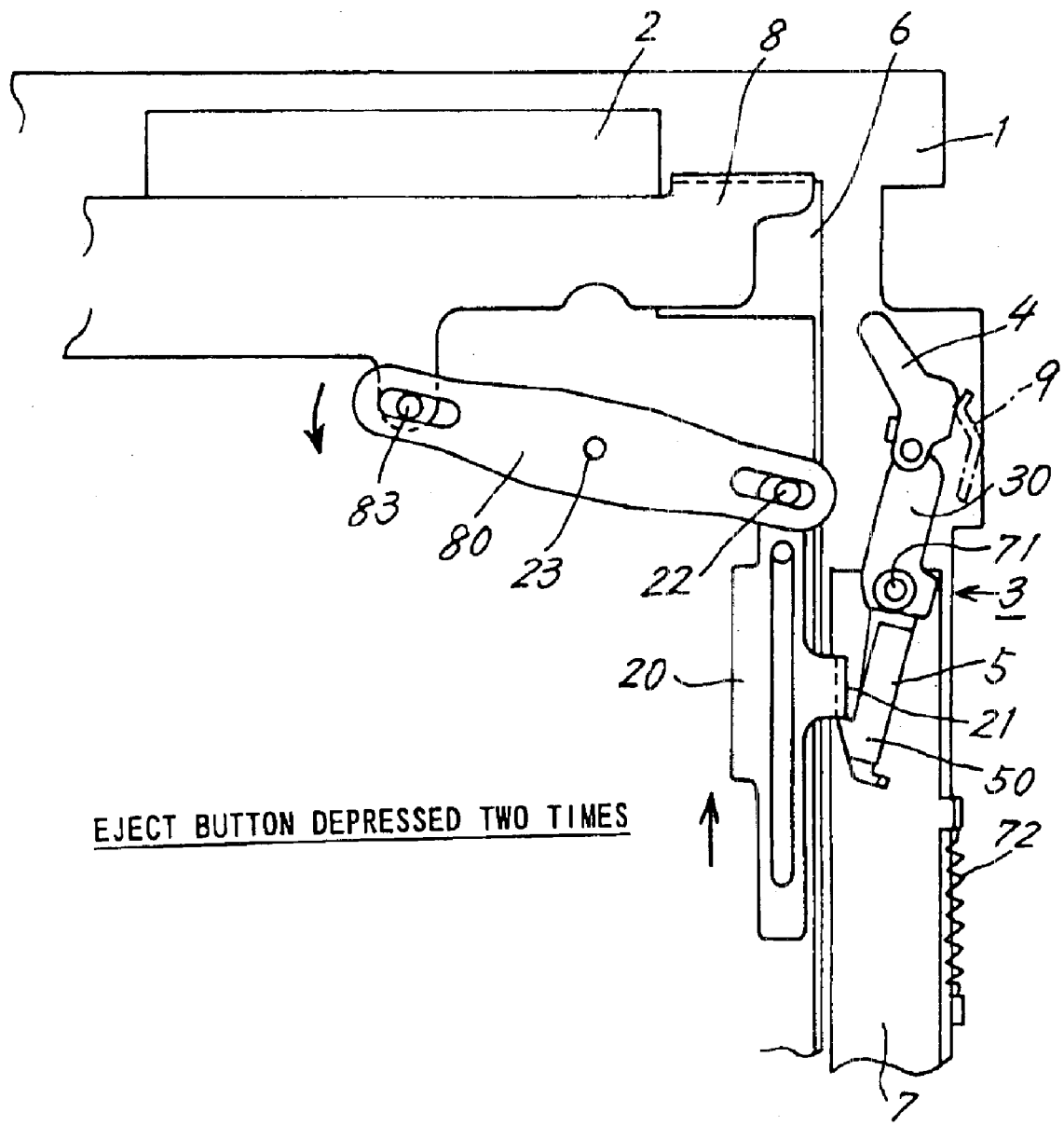
FIG. 14 is a plan view showing various components when the eject button has been pressed two times.
Figure 17:
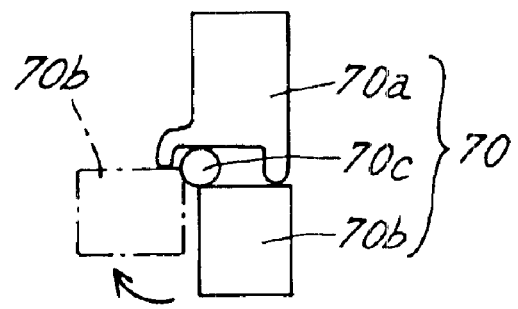
FIG. 17 is a plan view showing an eject button in which two half-button portions are connected by a hinge.

The user pushes the eject button 70 once again from the position where the eject button 70 protrudes backward. As shown in FIG. 14, with the forward movement of the slide unit 7, the claw piece 50 of the latch lever 5 catches the tab 21 of the intermediate slide plate 20, making the intermediate slide plate 20 move forward. The drive lever 80 swings counterclockwise, forcing the push-out plate 8 to move backward. The recording medium 6 is pushed out by the push-out plate 8, and as shown in FIG. 5, its rear end portion protrudes from the holder 2, allowing the user to grasp the rear end portion of the recording medium 6 and draw it out of the holder 2. The drive lever 80 and the push-out plate 8 return the positions shown in FIG. 10(*a*).

Because the recording medium 6 has been drawn out, the switching lever 4 is permitted to enter the travel path of the recording medium 6. As a result of the forward movement of the slide unit 7, the cam follower 32 moves forward from the rear end of the second longitudinal-groove 12*c*, passes through the diagonal groove 12*b* and the transverse groove 12*a*, and reaches the first longitudinal groove 11*a*. Because the intermediate lever 30 is urged counterclockwise by the torsion spring, it returns to the position shown in FIG. 10(*a*), and the flat spring unit 9 attached to the intermediate lever 30 accordingly swings counterclockwise from the position shown in FIG. 14. Because the forward end portion of the second urging portion 92 of the flat spring unit 9 is in contact with the inner side of the receiving piece 51, the latch lever 5 swings counterclockwise together with the flat spring unit 9.

As the slide unit 7 is urged by the tension spring 72, the cam follower 32 is, as shown in FIG. 10(*a*), placed to the rear end of the first longitudinal groove 11*a* in the cam groove 10. The eject button 70 is brought to a forwardly depressed position, as shown in FIG. 2.

With No Recording Medium Being Inserted

In the standby state shown in FIG. 10, if the eject button 70 is pushed forward without the recording medium 6 being inserted, the forward end portion of the switching lever 4 is kept in the travel path of the recording medium 6 by the flat spring unit 9 because the switching lever 4 is not pushed sideways by the recording medium 6. The cam follower 32 of the intermediate lever 30 cannot move to the transverse groove 12*a*, and therefore, even if the eject button 70 is pushed forward, the cam follower 32 moves forward only within the first longitudinal groove 11*a*. Because the position at which the cam follower 32 comes into contact with the rear end of the first longitudinal groove 11*a* is the depressed state of the eject button 70, the eject button 70 is held in its depressed state (see FIG. 15).

In the device according to the present embodiment, the eject button 70 is kept in a forwardly depressed state while in the standby state, and it does not protrude backward accidentally. With this being the case, there is no risk of inserting the recording medium 6 while in a state where the eject button 70 protrudes.

In addition, when the recording medium 6 is inserted in the holder 2, the recording medium 6 cannot be ejected unless the eject button 70 is pushed two times. This also eliminates the risk of a user's accidentally ejecting the recording medium 6.

In the present embodiment, the recording medium 6 has been illustrated as an example the insert and iVDR has been described as an example of the recording medium 6; however, floppy disks, IC cards, and memory cards may be employed therefor. In addition, the insert may be a tuner unit. Further, although not shown in the drawings, the recording medium 6 may be directly ejected by the drive lever 80. Additionally, the materials of the intermediate lever 30 and the latch lever 5 are not limited to those described in the embodiment.

Only selected embodiments have been chosen to illustrate the present invention. To those skilled in the art, however, it will be apparent from the foregoing disclosure that various changes and modifications can be made herein without departing from the scope of the invention as defined in the appended claims. Furthermore, the foregoing description of the embodiments according to the present invention is provided for illustration only, and not for limiting the invention as defined by the appended claims and their equivalents.

What is claimed is:

1. A device for accommodating an insert, comprising:

a chassis into which the insert may be installed detachably/reattachably;

an eject button adapted to be pressed along the direction in which the insert is installed;

a slide unit attached to the eject button and urged in an insert-ejection direction;

a push-out member interlocked with the slide unit, for pushing the insert in a direction in which the insert is ejected from the chassis; and a cam mechanism for switching the eject button between depressed and protruding states each time the eject button is pushed, wherein in a standby state the cam mechanism retains the eject button in the depressed state, and in a state in which the insert is installed into the chassis, by the eject button being pushed two times the push-out member and the slide unit operate inter-connectedly whereby the insert is ejected, wherein the cam mechanism has a first cam portion for permitting the eject button to move only forward from the depressed state, and a second cam portion permitting the eject button to move between the depressed state and the protruding state, wherein the slide unit and the cam mechanism interlock with a switching mechanism, the switching mechanism being spring-urged toward the push-out member and by being pushed against the spring by the insert when the insert is installed into the chassis, the switching mechanism withdrawing from a travel path of the insert, and wherein in the standby state the switching mechanism performs a first movement of interlocking into the first cam portion and advancing into the travel path of the insert, and with the insert being installed into the chassis, the switching mechanism performs a second movement of withdrawing from the travel path of the insert, wherein by a first pressing action on the eject button the switching mechanism shifts into the second cam portion, permitting the eject button to protrude backward, and by a second pressing action on the eject button the switching mechanism permits the push-out member and the slide unit to operate interconnectedly.

2. The device according to claim 1, wherein the insert is a recording medium, and a latch lever is pivotally supported on the slide unit, the latch lever performing a first movement for shifting together with the slide unit in a direction of ejecting the recording medium by a first action of pushing on the eject button with the switching mechanism being out of the travel path of the recording medium, and a second movement for driving the push-out member in the ejecting direction of the recording medium by a second action of pushing on the eject button.

* * * * *